(12) United States Patent
Augustine et al.

(10) Patent No.: US 10,374,584 B1
(45) Date of Patent: Aug. 6, 2019

(54) LOW POWER RETENTION FLIP-FLOP WITH LEVEL-SENSITIVE SCAN CIRCUITRY

(71) Applicant: Intel Corporation, Santa Clara, CA (US)

(72) Inventors: Charles Augustine, Portland, OR (US); Muhammad Khellah, Tigard, OR (US); Arvind Raman, Austin, TX (US); Feroze Merchant, Austin, TX (US); Ashish Choubal, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/916,130

(22) Filed: Mar. 8, 2018

(51) Int. Cl.
*H03K 3/037* (2006.01)
*G01R 31/3185* (2006.01)

(52) U.S. Cl.
CPC ... *H03K 3/0372* (2013.01); *G01R 31/318541* (2013.01); *H03K 3/0375* (2013.01)

(58) Field of Classification Search
None
See application file for complete search history.

(56) References Cited

U.S. PATENT DOCUMENTS

| | | | | |
|---|---|---|---|---|
| 7,332,949 B2 * | 2/2008 | Kim | ............... | G01R 31/318541 326/93 |
| 9,287,858 B1 * | 3/2016 | Singhal | ............... | H03K 3/012 |
| 9,634,649 B2 * | 4/2017 | Escobar | ............... | H03K 3/0372 |
| 9,647,644 B2 | 5/2017 | Kim et al. | | |
| 2003/0188241 A1 * | 10/2003 | Zyuban | ............ | G01R 31/31721 714/726 |
| 2006/0197571 A1 | 9/2006 | Kim | | |
| 2011/0248759 A1 | 10/2011 | Chi et al. | | |
| 2012/0131526 A1 | 5/2012 | Schreiber et al. | | |
| 2014/0040688 A1 | 2/2014 | Zhang et al. | | |
| 2018/0159513 A1 * | 6/2018 | Reddy | ............... | H03K 3/356008 |

FOREIGN PATENT DOCUMENTS

KR    20160069323    6/2016

OTHER PUBLICATIONS

International Search Report and Written Opinion from PCT/US2019/017366 notified May 30, 2019, 13 pgs.

* cited by examiner

*Primary Examiner* — Jeffery S Zweizig
(74) *Attorney, Agent, or Firm* — Green, Howard & Mughal LLP

(57) ABSTRACT

An apparatus comprising: a flip-flip comprising a master stage and a slave stage, wherein the slave stage is coupled to the master stage, wherein the master and slave stages are coupled to a first power supply rail; and a scan circuitry coupled to the slave stage of the flip-flip, wherein at least a portion of the scan circuitry is coupled to a second power supply rail.

19 Claims, 7 Drawing Sheets

US 10,374,584 B1

LOW POWER RETENTION FLIP-FLOP WITH LEVEL-SENSITIVE SCAN CIRCUITRY

BACKGROUND

There are several schemes to achieve low power consumption during low power mode (e.g., sleep mode). One such scheme is clock gating. In clock gating, clock is stopped from toggling during low power mode, and as such, dynamic capacitance is reduced which results in reducing power consumption. Compared to just clock gating, significant amount of leakage power can be saved by putting a processor core (or group of circuitries) into a sleep state, when the processor core (or the group of circuitries) is idle, by powering off its voltage supply. To ensure correct operation of the processor core, when the processor core comes out of sleep state or low power mode, data in critical control/data-path registers need to be preserved during sleep. However, preserving data during sleep with minimal impact to the performance of the processor core is a challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
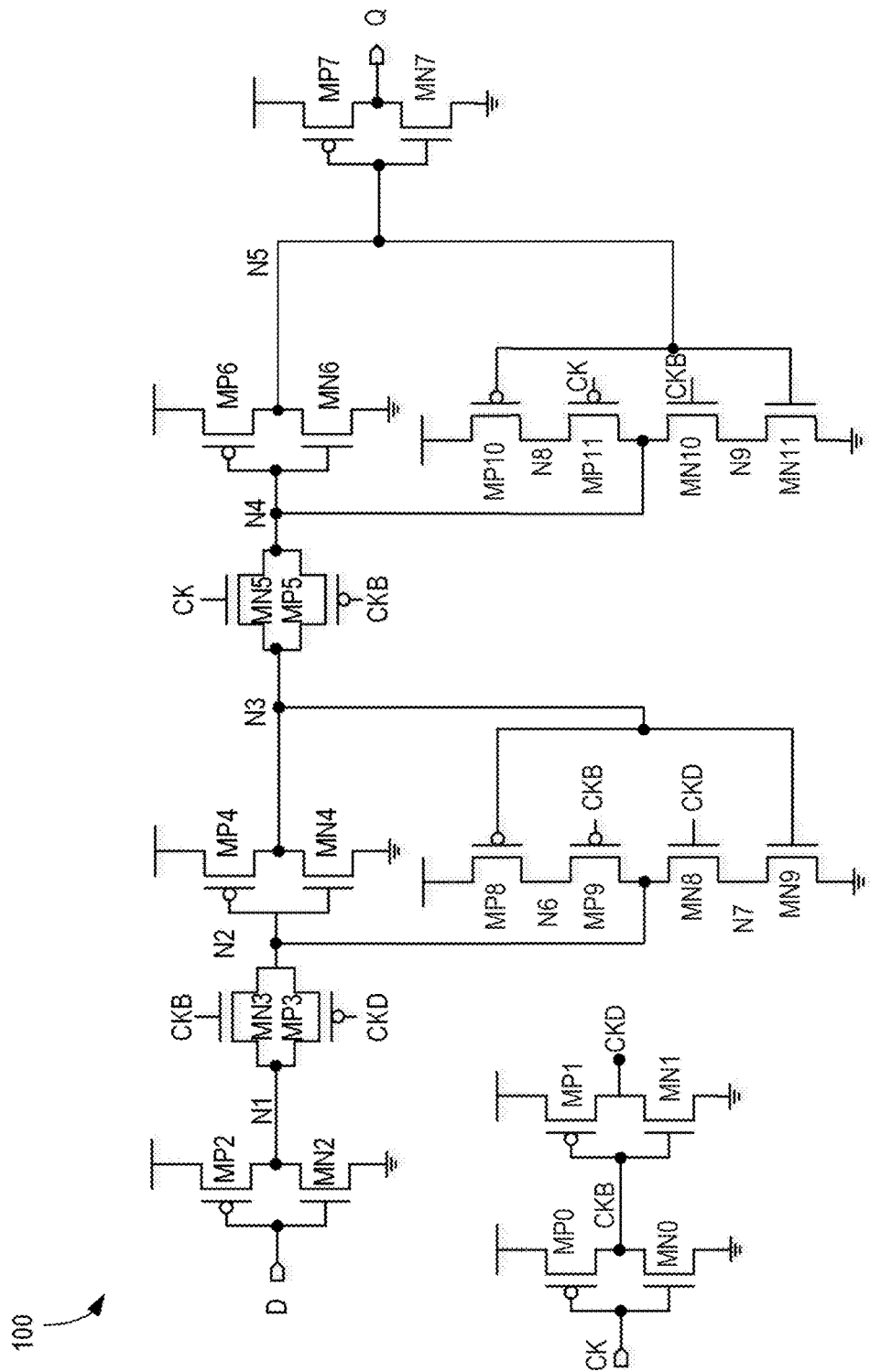
FIG. 1 illustrates a schematic of a flip-flop with no data retention during low power mode or sleep mode.

FIG. 1 illustrates a schematic of flip-flop 100 with no data retention during low power mode or sleep mode. Flip-flop 100 comprises a clock buffer which includes a first inverter (e.g., comprising p-type device MP0 and n-type device MN0 coupled together as shown) and a second inverter (e.g., comprising p-type device MP1 and n-type device MN1 coupled together as shown). The clock buffer receives an input clock CK and provides a buffered version of the input clock as CKD. Schematic 100 also includes a master stage and a slave stage, both controllable by the input clock CK and the buffered version of the input clock CKD. The master stage includes a first inverter (e.g., comprising p-type device MP2 and n-type device MN2 coupled together as shown), a pass-gate (e.g., comprising p-type device MP3 and an n-type device MN3 coupled together as shown) controllable by the buffered version of the input clock CKD and an inverse of the input clock CK (e.g., CKB); and a memory circuitry. The pass-gate is coupled to the first inverter at node N1. The memory circuitry includes a first inverter (e.g., p-type device MP4 and an n-type device MN4 coupled together as shown) and a second inverter (e.g., p-type devices MP8 and MP9, and n-type devices MN8 and MN9 coupled together as shown). The input of the memory circuitry is node N2 and the output of the memory circuitry is node N3. The internal nodes of the second inverter of the memory circuitry of the master stage are nodes N6 and N7.

The slave stage comprises a memory circuitry coupled to the memory circuitry of the master stage via a pass-gate (e.g., comprising p-type device MP5 and n-type device MN5). The memory circuitry of the slave stage comprises a first inverter (e.g., comprising p-type device MP6 and n-type device MN6 coupled together as shown) and a second inverter (e.g., comprising p-type devices MP10 and MP11, and n-type devices MN10 and MN11 coupled together as shown). The input of the memory circuitry is node N4 and the output of the memory circuitry is node N5, wherein the output of the memory circuitry of the slave stage is coupled to an output inverter (e.g., comprising p-type device MP7 and n-type device MN7 coupled together as shown). The internal nodes of the second inverter of the memory circuitry of the slave stage are nodes N8 and N9.

Here, the input to the flip-flop is provided as node D and the output of the flip-flop is provided at node Q. During low power mode, the clock CK can be gated which can reduce the dynamic capacitance of many nodes of the flip-flop. However, during clock gating, the devices of flip-flop may suffer from leakage since the power supply is on. Leakage may contribute to power consumption and also impact the data stored in the memory circuitries. For example, excessive leakage may cause the memory circuitries to lose their data from the storage nodes. Further, during low power mode, when the power supply is turned off for the flip-flop, its data is lost.

Some embodiments describe a sequential circuitry which comprises: a flip-flop; and a scan circuitry coupled to the flip-flip, wherein the scan circuitry is to retain data from the flip-flop when the flip-flop is in a low power state. In some embodiments, the scan circuitry is to store the retained data back to the flip-flop when the flip-flop transitions from the low power state (e.g., sleep state) to a high power state (e.g., normal active state, turbo state, etc.). In some embodiments, the scan circuitry is to scan data from the flip-flop to a scan output during a scan mode. In some embodiments, a portion of the scan circuitry is coupled to a power supply rail different from a power supply rail coupled to the flip-flop. In some embodiments, the scan circuitry is controllable by a scan signal which is generated by an inverter coupled to an ungated power supply rail. In some embodiments, an input of the inverter is coupled to an n-type pull-down device, and wherein the n-type pull-down device is controllable by a power mode signal which indicates the low power state.

There are many technical effects of the various embodiments. For example, the sequential circuitry of some embodiments re-use existing scan circuitry to store data during retention using a sleep signal while the scan circuitry is used as a normal scan gadget during scan mode. Compared to regular sequential circuitry with traditional scan circuitry, the sequential circuitry allows for data retention during low power mode without timing overhead and without degradation in performance (e.g., power consumption, clock-to-output delay, setup/hold timing margins, etc.). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Referring back to FIG. 1, one way to mitigate the challenges of clock gating is to retain data in the slave stage during retention mode (e.g., when the power supply to the flip-flop is turned off). For example, the master stage is powered by a first power supply while the slave stage is powered by a second power supply. In this case, the first power supply is turned off during a low power mode while the second power supply is on during the low power mode. One such embodiment is illustrated by FIG. 2.

Figure 2:
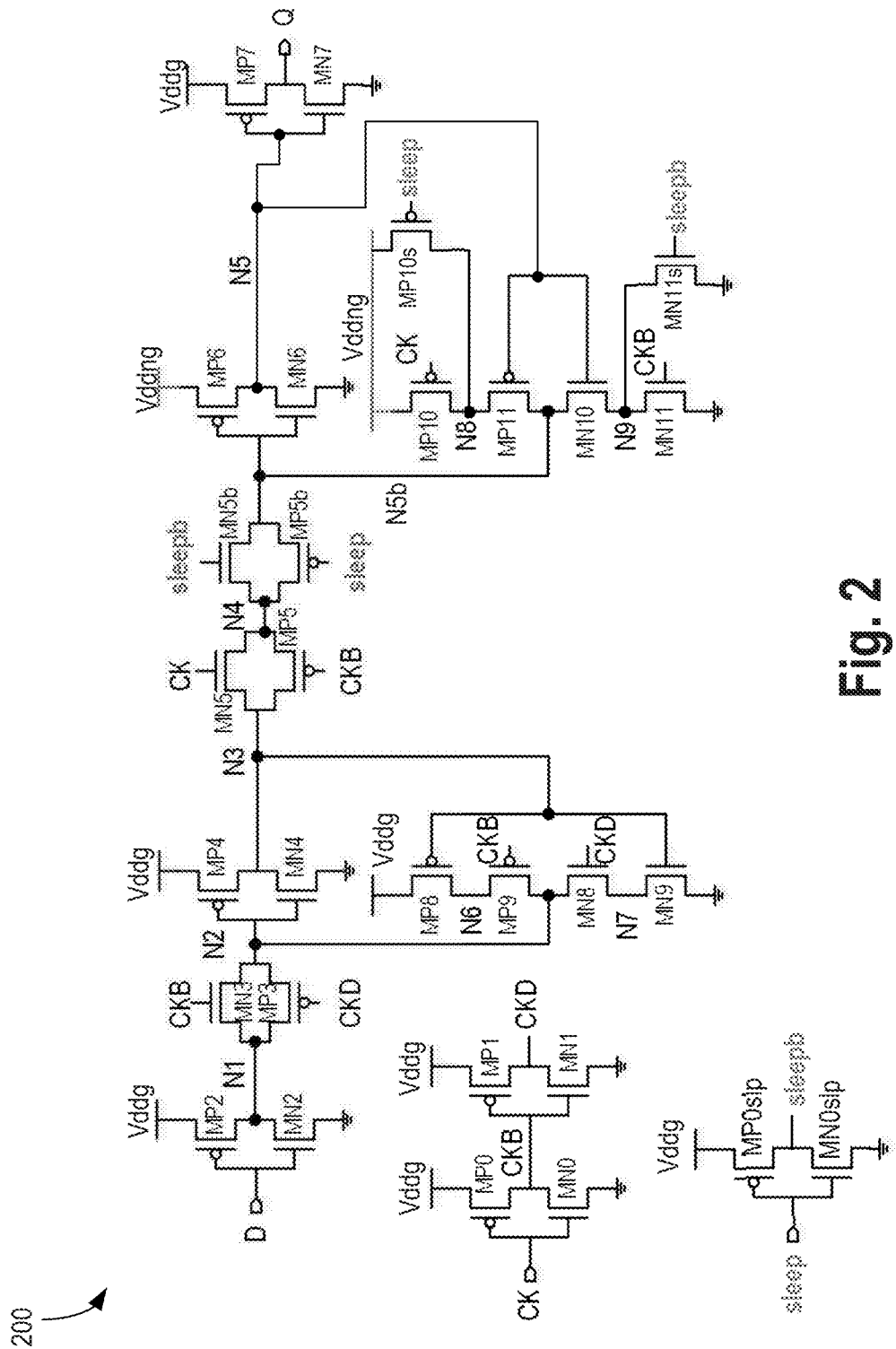
FIG. 2 illustrates a schematic of a flip-flop with additional circuitry and ungated power supply rail to support data retention during sleep mode, in accordance with some embodiments.

FIG. 2 illustrates a schematic of a flip-flop 200 with additional circuitry and ungated power supply rail to support data retention during sleep mode, in accordance with some embodiments. In some embodiments, the slave stage is powered by an ungagged power supply (Vddng) while the rest of flip-flop 200 is powered by a gated power supply (Vddg). A person skilled in the art would appreciate that a gated power supply is a controlled power supply that can be switched off (e.g., gated) during a low power mode (e.g., sleep mode). The gated power supply Vddg can be generated by a power gate (e.g., a pass-gate) which is coupled to the gated power supply rail (Vddg) and the ungated power supply rail (Vddng) and controllable by a power mode signal. In some embodiments, during sleep mode (e.g., when sleep=1), the gated power supply Vddg is turned off (e.g., Vddg=0) and the slave stage which is powered by the ungated power supply Vddng (e.g., an always-on power supply) is used to store the data (e.g., retain data) in its storage node N5. In some embodiments, the low power mode signal (e.g., sleep signal) is generated using the ungated power supply Vddng. In some embodiments, since sleep is enabled when it's a logic high, the inverter generating sleepb can be powered by the gated power supply Vddg. For example, inverter comprising p-type device MP0*slp* and MN0*slp* is powered by Vddg to generate sleepb (e.g., inverse of sleep).

In some embodiments, to isolate the slave stage from the master stage during sleep mode, an additional pass-gate is introduced between the pass-gate (having transistors MN5 and MP5) and the slave stage. For example, the pass-gate having transistors MN5*b* and MP5*b* is coupled to nodes N4 and N5*b*, where the pass-gate is controllable by the sleep and sleepb signals. In some embodiments, the second inverter of the slave stage is also controllable by the sleep signals. For example, p-type transistor MP10s is introduced and coupled in parallel with p-type transistor MP10, and n-type transistor MP11s is introduced and coupled in parallel with p-type transistor MN11, where transistor MP10s is controllable by a sleep signal while transistor MP11s is controllable by the sleepb signal.

While the embodiment of FIG. 2 provides data retention during sleep mode, it does so with a negative impact on performance. For example, during an active mode (e.g., in the absence of sleep mode), flip-flop 200 may exhibit slower performance in active mode due to the additional transmission-gate (e.g., transistors MN5b and MP5b) in series with the traditional pass-gate (having transistors MP5 and MN5). In one example, the additional pass-gate can result in 30% performance loss (e.g., slower clock-to-output, lesser setup time margin, etc.). Further, the provision of two different power supplies (e.g., gated power supply for the master stage and un-gated power supply for the slave stage) may cause signal level-shifting issues.

Figure 3:
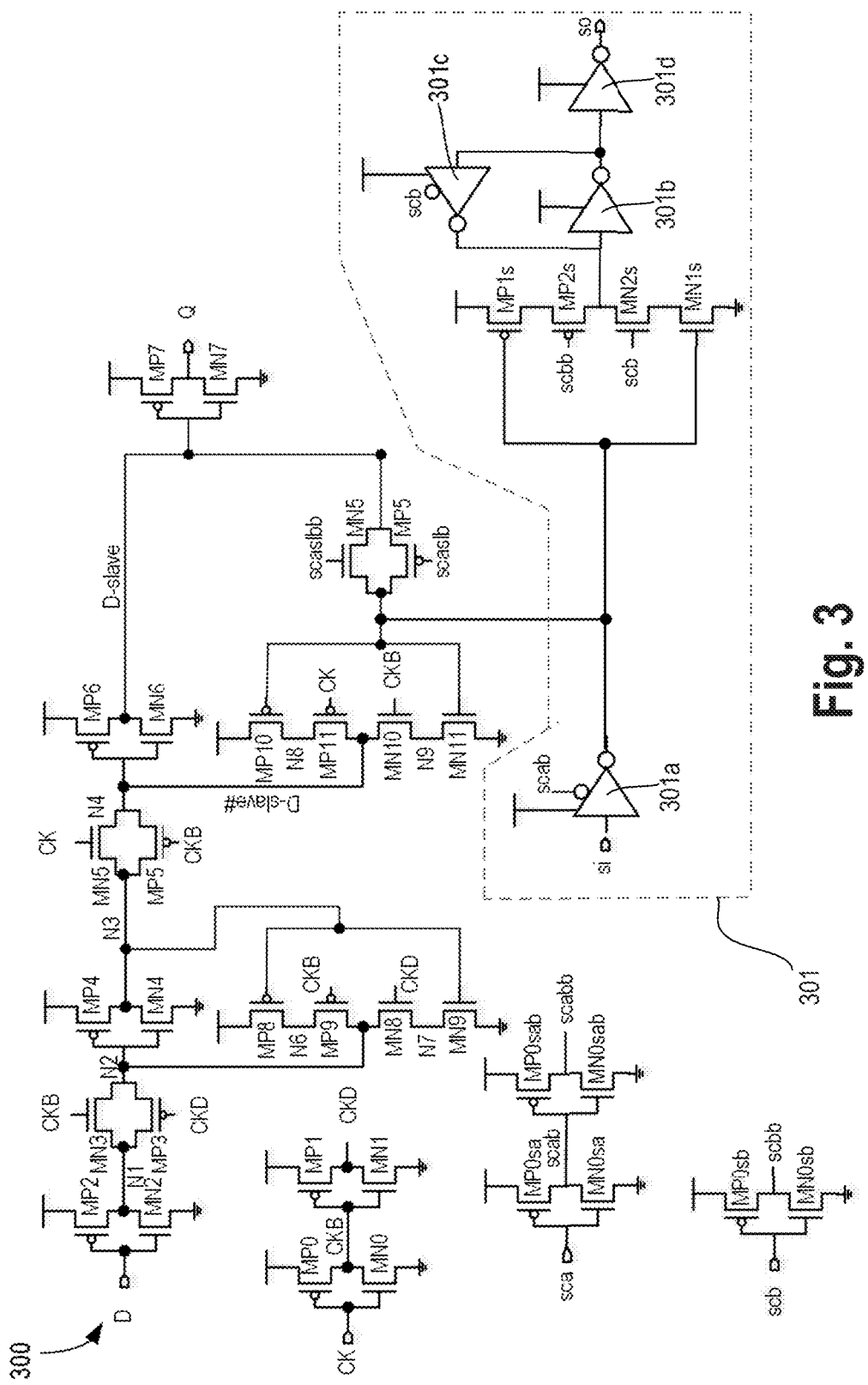
FIG. 3 illustrates a schematic of a flip-flop with scan circuitry, in accordance with some embodiments.

FIG. 3 illustrates a schematic of a flip-flop 300 with scan circuitry. Flip-flop 300 is similar to flip-flop 100 but for the extra scan circuitry 301 which is coupled to the slave stage. Flip-flop 300 comprises a level-sensitive scan (LSSD) which can be used in high speed designs. In some embodiments, scan circuitry 301 comprises tri-statable inverters 301a, 301b, and 301c coupled together as shown. One tri-statable inverter is shown coupled to tri-statable inverter 301a and the slave stage. This tri-statable inverter comprises p-type transistors MP1s and MP2s, and n-type transistors MN1s and MN2s. The scan-input is "si" and scan output is "so". During regular mode, tri-statable inverter 301a is tri-stated and the data stored in the memory circuitry of the slave stage is also copied over in the memory circuitry of the scan circuitry 301. The memory circuitry of the scan circuitry 301 comprises tri-statable inverters 301b and 301c. During scan-in mode, tri-statable inverter 301a is enabled allowing the scan input "si" to be passed on to scan circuitry 301. In some embodiments, to enable scan circuitry 301, a pass-gate is introduced in the memory circuitry of the slave stage. In some embodiments, during scan-out operation, inverter 301a is tristated, and the output on "so" is retrieved. Here, that pass-gate comprises transistors MN5 and MP5, which are also coupled to the scan circuitry 301. The memory circuitry of the slave stage stores the data in nodes D-slave and D-slave#. The scan signals sca and scb are used to control scan circuitry 301. Here, scan signal scbb is generated by inverter having transistors MP0sb and MN0sb, while scan signals scabb and scab are generated by inverters comprising transistors MP0sa, MN0sa, MP0sab, and MN0sab as shown.

Figure 4:
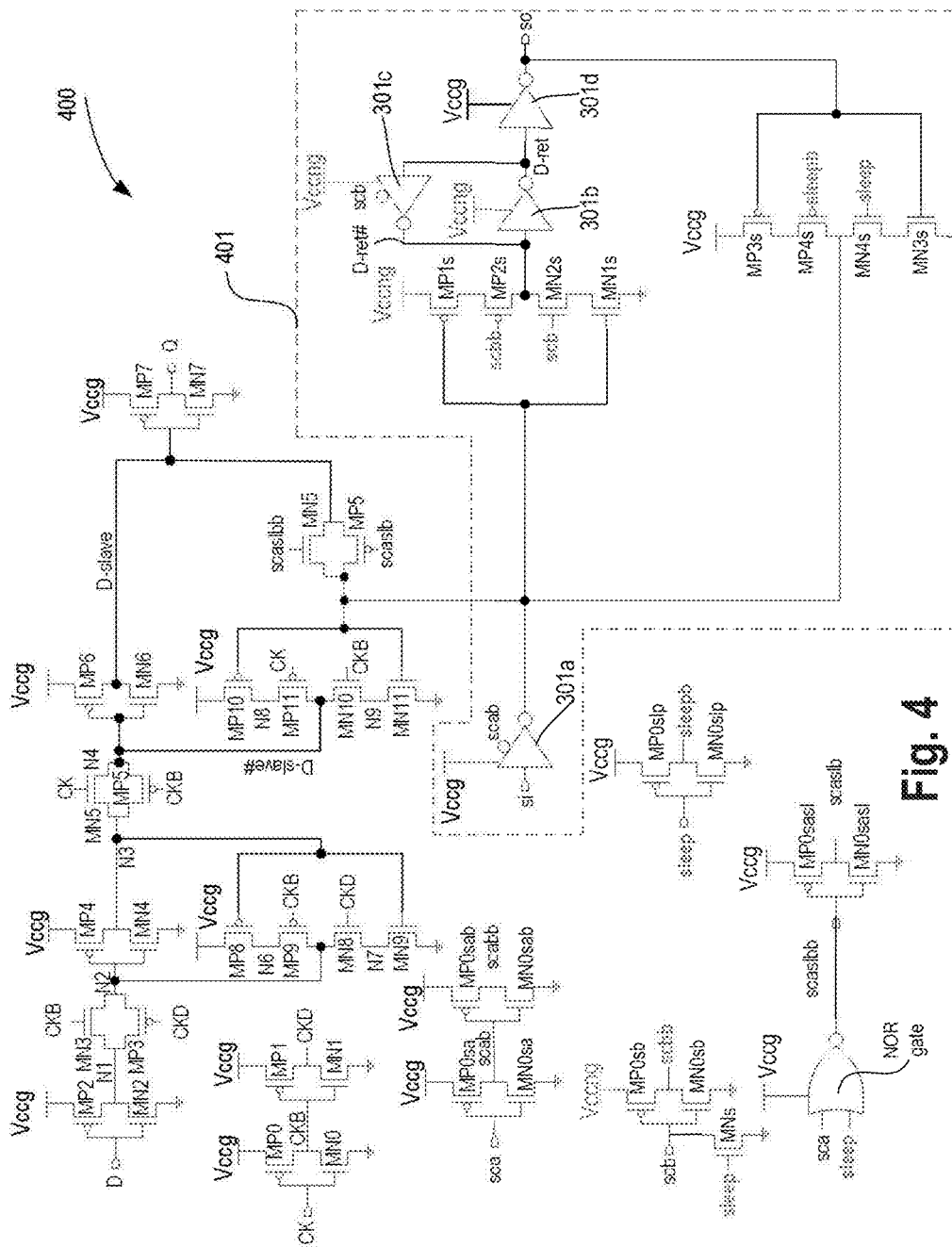
FIG. 4 illustrates a schematic of a flip-flop with scan circuitry and data retention apparatus, in accordance with some embodiments.

FIG. 4 illustrates a schematic of flip-flop 400 with scan circuitry and data retention apparatus, in accordance with some embodiments. Flip-flop 400 supports level-sensitive scan (LSSD) which is used in high-performance logics and processor core(s). An LSSD library flop performance can be critical due to high speed mode requirement of the logics and/or processing cores (e.g., frequency greater than 3 GHz). Some embodiments use the LSSD scan gadget to store data during retention using the sleep signal along with existing scan signal scb.

Flip-flop 400 comprises scan circuitry 401 which is similar to scan circuit 301 but for the additional feedback loop provided by a tri-stateable inverter (comprising p-type transistors MP3s, MP4s, and n-type transistors MN3s and MN4s coupled together as shown), and circuitries for generating scaslb and scbb signals. In this example, LSSD flip-flop 400 is converted into LSSD retention flip-flop which can be used in high speed designs.

In some embodiments, an additional pull-down transistor MNs is added to pull down node scb to ground when sleep is at logic high. As such, when sleep is '1', scbb is '1' because scbb node is pulled up to Vccng by transistor MP0sb. In some embodiments, NOR gate is provided which performs a NOR function between sca and sleep, and the output scaslbb of the NOR gate is received by the inverter having transistors MP0sasl and MN0sasl to provide scaslb. In some embodiments, a portion of scan circuitry 401 is on the ungated power supply Vccng as shown while some portion of scan circuitry 401 is on the gated power supply Vccg. In some embodiments, moving data from the slave stage to scan circuitry 401 (also referred to a balloon stage) is similar to scan-out operation of FIG. 3. Further, functionally, both regular scan-in and scan-out operations are unchanged in the embodiments of FIG. 4 compared to FIG. 3. In some embodiments, Vccng is turned OFF when data is no longer needed to be retained (e.g. during system shutdown).

Figure 5:
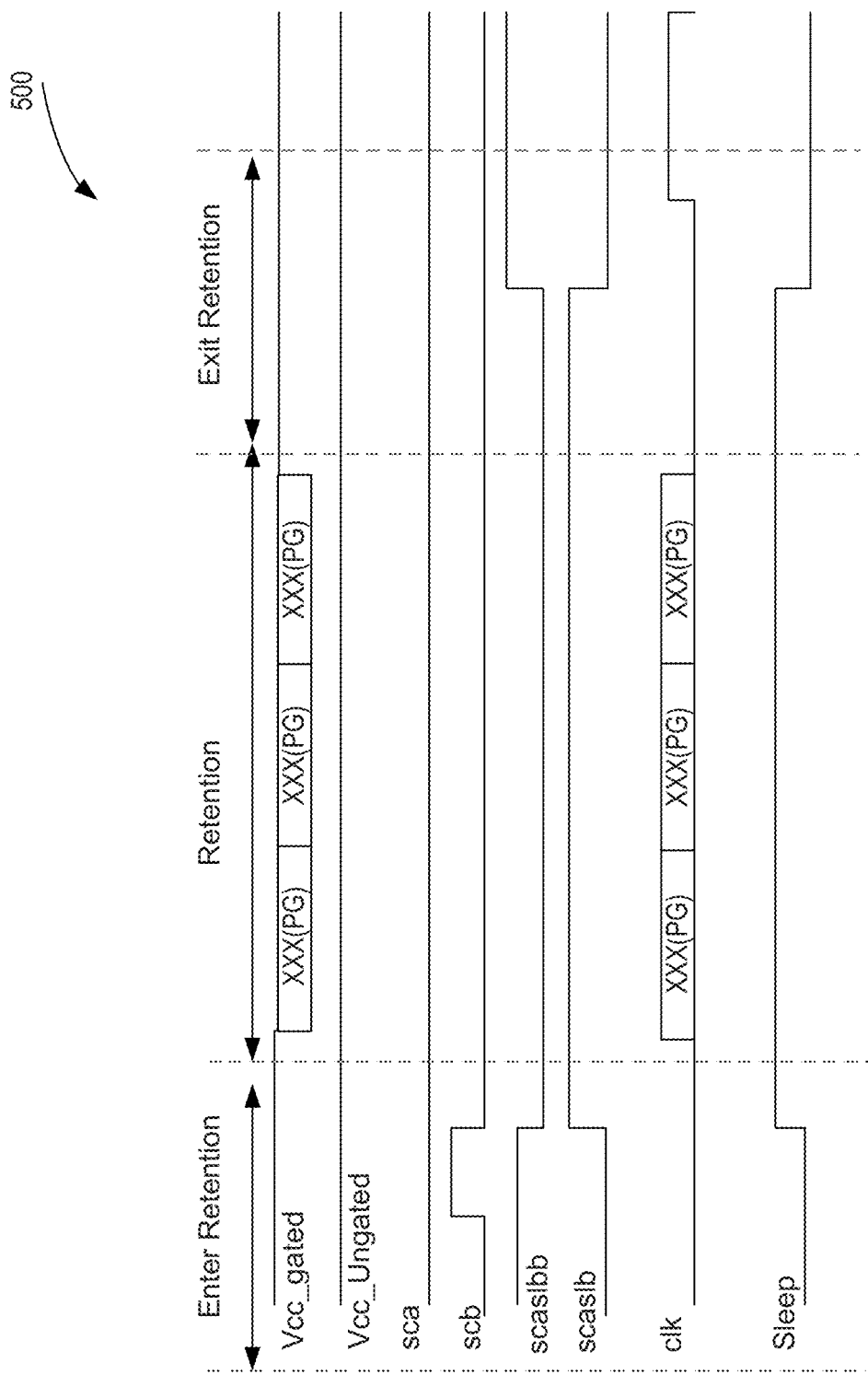
FIG. 5 illustrates a timing diagram for the flip-flop of FIG. 4, in accordance with some embodiments.

FIG. 5 illustrates a timing diagram 500 for flip-flop 400 of FIG. 4, in accordance with some embodiments. Prior to entering a retention state, data is moved from the slave-stage of the flop 400 into the scan-gadget 401. Here, scan circuitry 401 is also referred to as the scan-gadget or balloon stage. The movement of data is enabled by pulsing the scb signal when CLK (CK) is gated and sca is driven to '0', which will move data from the slave-stage nodes (D-slave & D-slave#) to scan-gadget 401 (e.g., balloon stage, D-ret & D-ret#). Note that this is the same operation of scanning out data from flip-flop 400. Next, low power mode signal (e.g., sleep signal) is activated to force scb signal to go to zero, which enables the inverter feedback loop in scan circuitry 401 to retain the data using ungated Vcc (Vccng), while gated Vcc (Vccg) can be turned OFF and data is retained in the flip-flop 400. In some embodiments, the number of gates supplied by the ungated Vcc (Vccng) is merely four, and two of these gates have stacked transistor which further reduces leakage. In some embodiments, transistors in these four gates are of SVT (standard threshold Vt) type to further reduce the leakage.

During the retention state, the sleep signal is driven high to ensure that scb signal is '0' to provide isolation for the balloon latch 401 storing data. In this state, gated Vcc is powered OFF and the rest of the signals are floating (sca, D, Q, and CK).

To exit retention state, data is copied back from balloon stage 401 into the slave stage. To start, gated Vcc is ramped up first to supply voltage to the slave stage. Since the transmission gate controlled by scaslb is OFF (e.g., logic 1), data can be written back to D-slave and D-slave#. The sleep signal is then de-asserted to enable slave stage feedback loop and to decouple the slave stage from the balloon stage 401.

Figure 6:
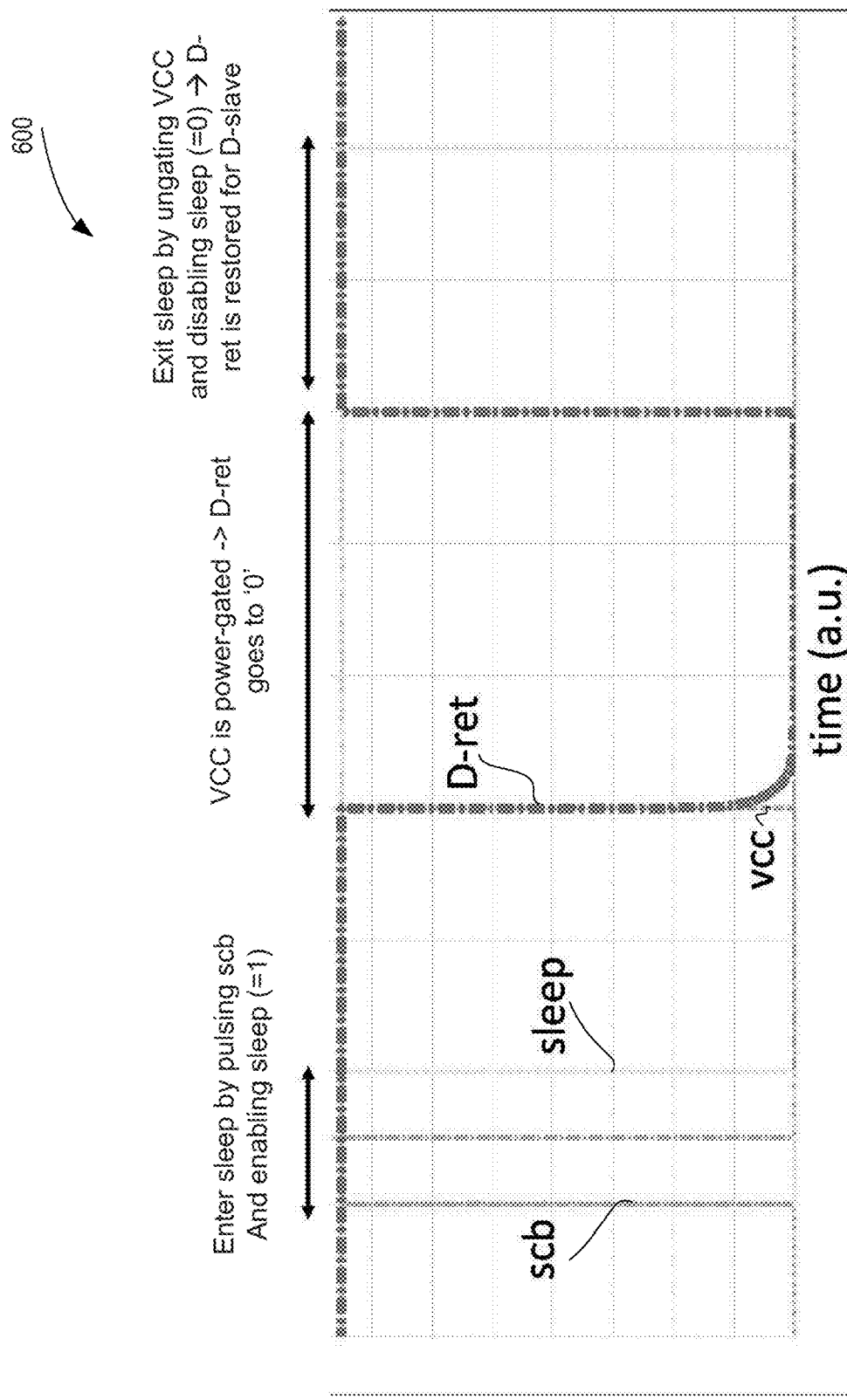
FIG. 6 illustrates a plot showing transient simulation at various nodes of the flip-flop of FIG. 4, in accordance with some embodiments.

FIG. 6 illustrates plot 600 showing transient simulation at various nodes of flip-flop 400 of FIG. 4, in accordance with some embodiments. Here, the x-axis is time (in arbitrary unit (a.u.) and the y-axis is voltage. Four waveforms are shown in plot 600 including voltages on nodes scb, sleep, D-ret, and Vcc. To enable sleep, scb is pulsed and then sleep is enabled as it transitions from 0 to 1. The gated Vcc (Vccg) is then powered down which causes the voltage on node D-ret to go to zero. To exit from the retention state, sleep signal is disabled which transitions from 1 to 0 and the voltage on D-ret node is restored on node D-slave.

Figure 7:
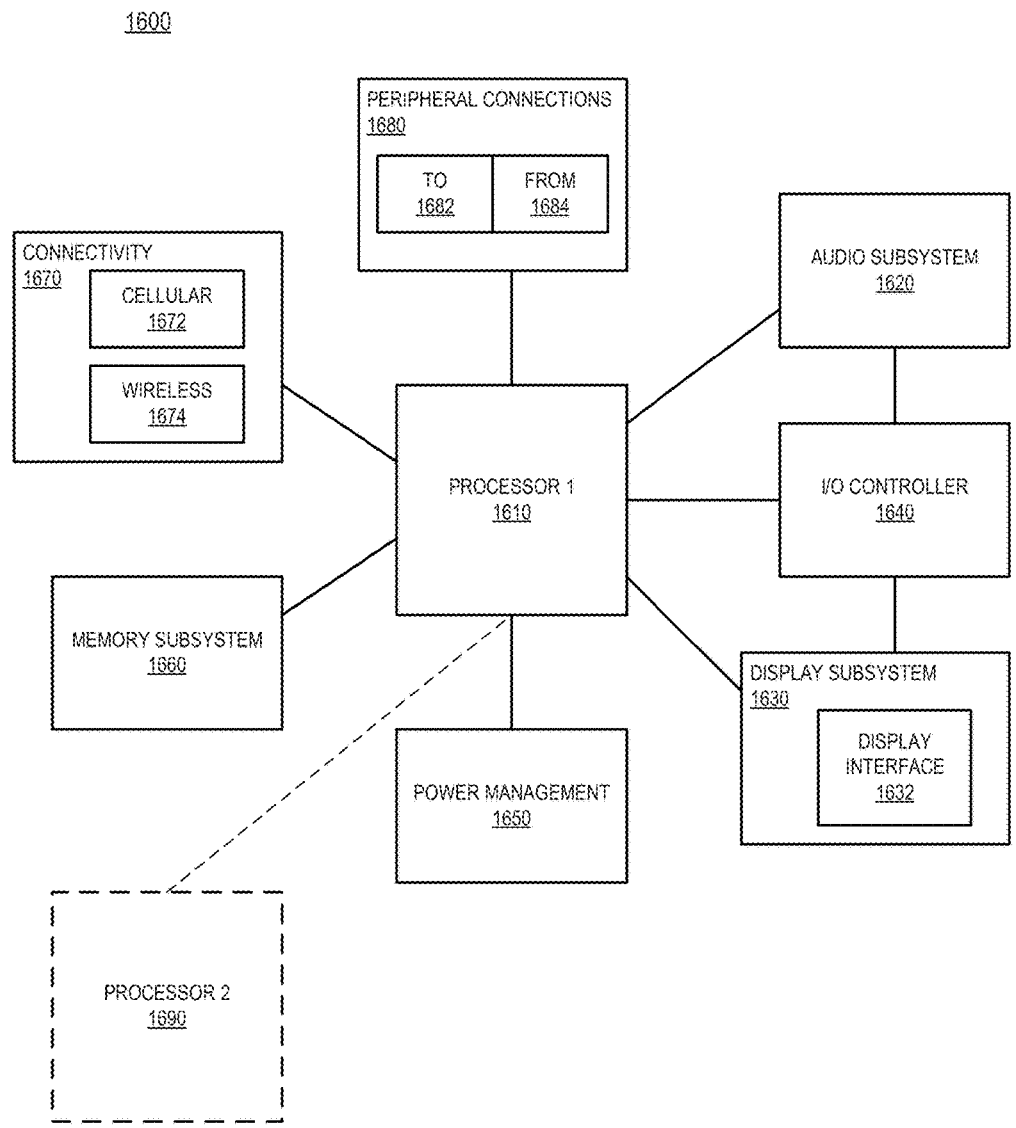
FIG. 7 illustrates a smart device or a computer system or a SoC (System-on-Chip) having one or more data retention flip-flops, according to some embodiments of the disclosure.

FIG. 7 illustrates a smart device or a computer system or a SoC (System-on-Chip) having one or more data retention flip-flops, according to some embodiments of the disclosure. FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having one or more data retention flip-flops, according to some embodiments discussed. Other blocks of the computing device 1600 may also include one or more data retention flip-flops, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a flip-flip comprising a master stage and a slave stage, wherein the slave stage is coupled to the master stage, wherein the master and slave stages are coupled to a first power supply rail; and
   a scan circuitry coupled to the slave stage of the flip-flip, wherein at least a portion of the scan circuitry is coupled to a second power supply rail, wherein the scan circuitry comprises an inverter connected to the slave stage, wherein the inverter is controllable by a scan signal, and wherein the inverter is coupled to the second power supply rail.

2. The apparatus of claim 1, wherein the first power supply rail is to provide a first power supply, wherein the second power supply rail is to provide a second power supply, and wherein when the first power supply is turned off, the second power supply is still on.

3. The apparatus of claim 1, wherein the inverter is a first inverter, wherein the scan signal is generated by a second inverter, and wherein the first and second inverters are coupled to the second power supply rail.

4. The apparatus of claim 3, wherein the scan circuitry comprises a memory circuitry coupled to an output of the first inverter.

5. The apparatus of claim 4 comprises a third inverter coupled to an output of the memory circuitry.

6. The apparatus of claim 5 comprises a fourth inverter coupled to an output of the third inverter and an input of the first inverter, wherein the fourth inverter is controllable by a sleep signal.

7. The apparatus of claim 6, wherein the sleep signal is generated by a fifth inverter coupled to the first supply rail.

8. An apparatus comprising:
   a flip-flop; and
   a scan circuitry coupled to the flip-flip, wherein the scan circuitry is to retain data from the flip-flop when the flip-flop is in low power state, wherein the scan circuitry comprises an inverter connected to a slave stage of the flip-flop, wherein the inverter is controllable by a scan signal, and wherein the inverter is coupled to a power supply rail separate from a power supply coupled to the flip-flop.

9. The apparatus of claim 8, wherein the scan circuitry is to store the retained data back to the flip-flop when the flip-flop transitions from the low power state to a high power state.

10. The apparatus of claim 8, wherein the scan circuitry is to scan data from the flip-flop to a scan output during a scan mode.

11. The apparatus of claim 8, wherein a portion of the scan circuitry is coupled to the power supply rail separate from the power supply rail coupled to the flip-flop.

12. The apparatus of claim 8, wherein an input of the inverter is coupled to an n-type pull-down device, and wherein the n-type pull-down device is controllable by a power mode signal which indicates the low power state.

13. A system comprising:
   a memory;
   a processor coupled to the memory, wherein the processor includes a sequential circuitry including:
      a flip-flip comprising a master stage and a slave stage, wherein the slave stage is coupled to the master stage, wherein the master and slave stages are coupled to a first power supply rail; and
      a scan circuitry coupled to the slave stage of the flip-flip, wherein at least a portion of the scan circuitry is coupled to a second power supply rail, wherein the scan circuitry comprises an inverter connected to the slave stage, wherein the inverter is controllable by a scan signal, and wherein the inverter is coupled to the second power supply rail; and
   a wireless interface to allow the processor to communicate with another device.

14. The system of claim 13, wherein the first power supply rail is to provide a first power supply, wherein the second power supply rail is to provide a second power supply, and wherein when the first power supply is turned off, the second power supply is still on.

15. The system of claim 13, wherein the inverter is a first inverter, wherein the scan signal is generated by a second inverter, wherein the first and second inverters are coupled to the second power supply rail.

16. The system of claim 15, wherein the scan circuitry comprises a memory circuitry coupled to an output of the first inverter.

17. The system of claim 16 comprises a third inverter coupled to an output of the memory circuitry.

18. The system of claim 17 comprises a fourth inverter coupled to an output of the third inverter and an input of the first inverter, wherein the fourth inverter is controllable by a sleep signal.

19. The system of claim 18, wherein the sleep signal is generated by a fifth inverter coupled to the first supply rail.

* * * * *